United States Patent
Kadosh et al.

(10) Patent No.: US 6,720,227 B1
(45) Date of Patent: Apr. 13, 2004

(54) METHOD OF FORMING SOURCE/DRAIN REGIONS IN A SEMICONDUCTOR DEVICE

(75) Inventors: Daniel Kadosh, Austin, TX (US); Jon D. Cheek, Round Rock, TX (US); James F. Buller, Austin, TX (US); Basab Bandyopadhyay, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 159 days.

(21) Appl. No.: 10/059,615

(22) Filed: Jan. 29, 2002

Related U.S. Application Data

(63) Continuation of application No. 09/624,847, filed on Jul. 25, 2000, now abandoned.

(51) Int. Cl.[7] .............................................. H01L 21/336
(52) U.S. Cl. ....................... 438/305; 438/229; 438/230; 438/231; 438/299; 438/301; 438/303; 438/307; 438/595
(58) Field of Search ................................. 438/229, 230, 438/231, 232, 299, 301, 303, 305, 306, 307, 595

(56) References Cited

U.S. PATENT DOCUMENTS

| | | | | |
|---|---|---|---|---|
| 5,308,780 A | * | 5/1994 | Chou et al. | 438/202 |
| 6,025,239 A | * | 2/2000 | Yu | 438/302 |
| 6,060,364 A | * | 5/2000 | Maszara et al. | 438/305 |
| 6,204,138 B1 | * | 3/2001 | Krishnan et al. | 438/307 |
| 6,211,023 B1 | * | 4/2001 | Yeh et al. | 438/299 |

* cited by examiner

*Primary Examiner*—Amir Zarabian
*Assistant Examiner*—Toniae M. Thomas
(74) *Attorney, Agent, or Firm*—Williams, Morgan & Amerson, P.C.

(57) ABSTRACT

A method of forming source/drain regions in a semiconductor device is provided. In one illustrative embodiment, the method comprises forming a gate electrode above a semiconducting substrate, forming source/drain regions in the substrate adjacent the gate electrode by performing at least the following steps: performing two ion implantation processes to form source/drain extensions for the device and performing a third ion implantation process to further form source/drain regions for the device. Various N-type and P-type dopant atoms such as arsenic, phosphorous, boron and boron difluoride may be used with the present invention.

34 Claims, 3 Drawing Sheets

METHOD OF FORMING SOURCE/DRAIN REGIONS IN A SEMICONDUCTOR DEVICE

This is a continuation of application Ser. No. 09/624,847 filed Jul. 25, 2000 now abandoned.

BACKGROUND OF THE INVENTION

1. Field of the Invention

The present invention is generally directed to semiconductor processing, and, more particularly, to a method of forming source/drain regions in a semiconductor device.

2. Description of the Related Art

By way of background, FIGS. 1A and 1B depict an illustrative, partially complete, NMOS field effect transistor 10 formed above a surface 14 of a semiconducting substrate 12 between trench isolation regions 25. At this stage of fabrication, the transistor 10 is comprised of a gate insulation layer 16 and a gate electrode 18. Ultimately, as shown in FIG. 1B, source/drain regions 28 will be formed in the substrate 12 adjacent the gate electrode 18.

FIGS. 1A and 1B depict one illustrative prior art process flow for forming source/drain regions 28 in a semiconductor device. As shown therein, the process typically involves performing a first ion implantation process 13 to form doped regions 15 in the substrate. This implant is commonly referred to as an extension implant since it will become an extension of the completed source/drain region. Note that, on at least the illustrative NMOS device depicted in FIG. 1A, this extension implant 13 is generally self-aligned with respect to the gate electrode 18. The dopant concentration of this initial implant process ranges from approximately $1 \times 10^{14}$ to $5 \times 10^{15}$ ions/cm$^2$ of the appropriate dopant atoms for the technology under consideration, e.g., arsenic or phosphorous for NMOS technology, boron for PMOS technology, etc, and at an energy level ranging from approximately 1–20 keV.

Thereafter, as shown in FIG. 1B, sidewall spacers 20 are formed adjacent the gate electrode 18 by depositing a layer of spacer material and performing an anisotropic etching process. Next, a second ion implantation process 17 is performed to form implant regions 19 in the substrate 12. This second implant 17 is commonly referred to as the source/drain implant because it constitutes the bulk of the completed source/drain regions 28 of the device. The source/drain implant 17 is typically generally self-aligned with respect to the sidewall spacer 20. The source/drain implant 17 may be performed with a dopant concentration ranging from approximately $5 \times 10^{14}$ to $5 \times 10^{15}$ ions/cm$^2$ and at an energy level ranging from approximately 20–40 keV. Thereafter, the device is subjected to one or more anneal processes to activate the implanted dopant atoms and to repair any damage to the lattice structure of the silicon resulting from the ion implantation process as described above. During this anneal process, the dopant atoms will migrate, or move, from their implanted position, although this is not indicated in FIG. 1A or 1B. This dopant migration tends to be isotropic in direction, although such movement is not depicted in FIG. 1B.

One problem found in modern semiconductor devices is known as off-state leakage currents. That is, as the name implies, when the transistor is "off," i.e., when there is approximately zero volts applied to the gate electrode 18 of an NMOS device, some small current still flows between the source/drain regions 28 of the device. Such off-state leakage currents are problematic in that they unnecessarily consume power while not serving any useful function. This is particularly problematic in modern portable devices where power consumption is of key concern. Off-state leakage currents may also result in excessive chip heat, requiring heat sinks, fans, or other cooling devices.

There are several concerns with respect to the formation of source/drain regions 28, and, in particular, to the formation of the source/drain extensions using the prior art process described above. In general, the more shallow the source/drain extension implant, the better the device will perform from a leakage perspective. However, all other things being equal, the more shallow the depth of the source/drain extension implant, the greater the resistance of the source/drain extension to electron flow. The increase in resistance is undesirable from an operational point of view as it would produce a slower chip. Conversely, if the source/drain extensions are made too deep in an effort to reduce the resistance, off-state leakage currents tend to increase.

The present invention is directed to a method that solves or reduces some or all of the aforementioned problems.

SUMMARY OF THE INVENTION

A method of forming source/drain regions in a semiconductor device is provided. In one illustrative embodiment, the method comprises forming a gate electrode above a semiconducting substrate, forming source/drain regions in the substrate adjacent the gate electrode by performing at least the following steps: performing two ion implantation processes to form source/drain extensions for the device and performing a third ion implantation process to further form source/drain regions for the device. Various N-type and P-type dopant atoms such as arsenic, phosphorous, boron and boron difluoride may be used with the present invention.

BRIEF DESCRIPTION OF THE DRAWINGS

The invention may be understood by reference to the following description taken in conjunction with the accompanying drawings, in which like reference numerals identify like elements, and in which.

Figure 1A:
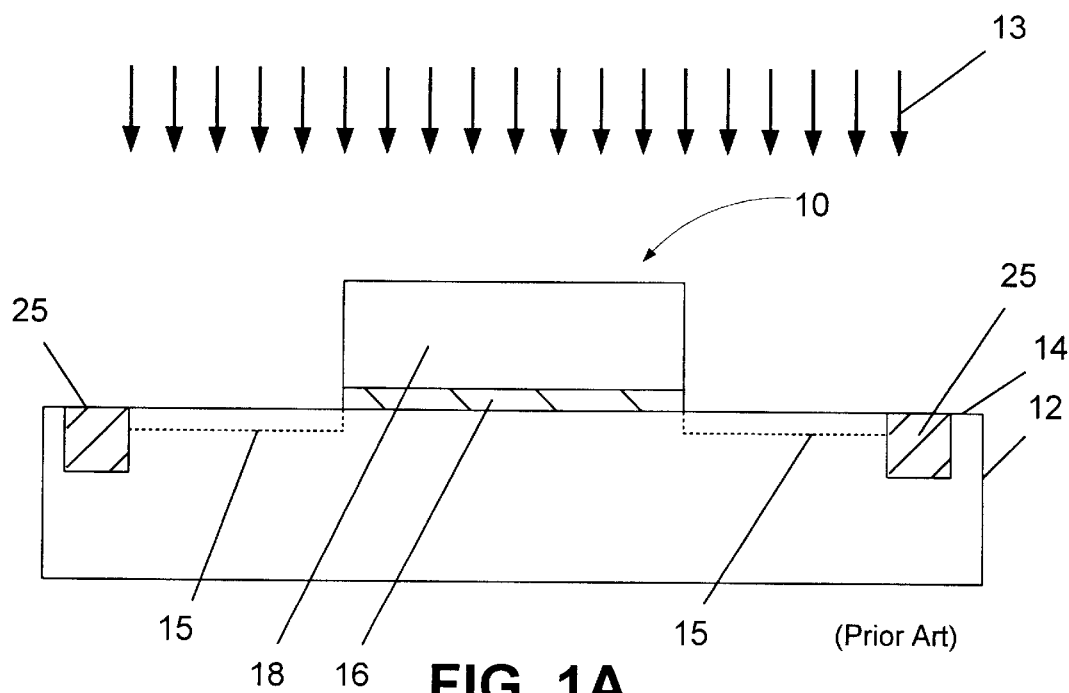
FIGS. 1A and 1B depict an illustrative prior art method for forming source/drain regions in a semiconductor device.
Figure 1B:
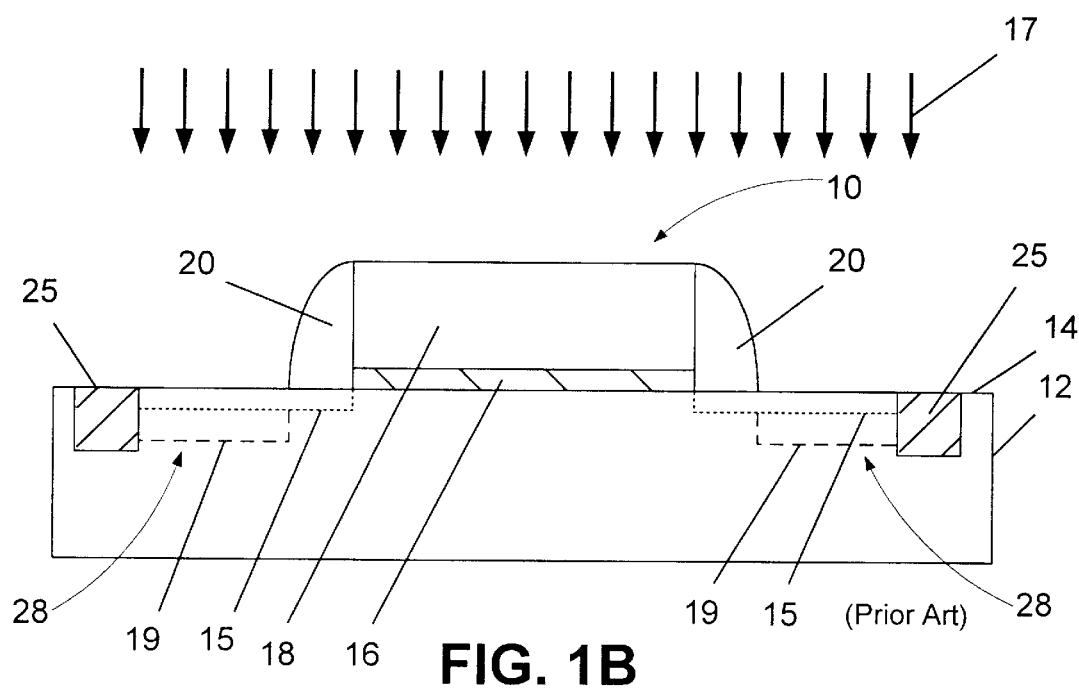

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 2–5. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features depicted in the drawings may be exaggerated or reduced as compared to the size of those features or regions on fabricated devices. Nevertheless, the attached drawings are included to describe and explain illustrative examples of the present invention.

In general, the present invention is directed to a method of forming source/drain regions in a semiconductor device. As will be readily apparent to those skilled in the art upon a complete reading of the present application, the present method is applicable to a variety of technologies, e.g., NMOS, PMOS, CMOS, etc., is readily applicable to a variety of devices, including, but not limited to, logic devices, memory devices, etc.

Figure 2:
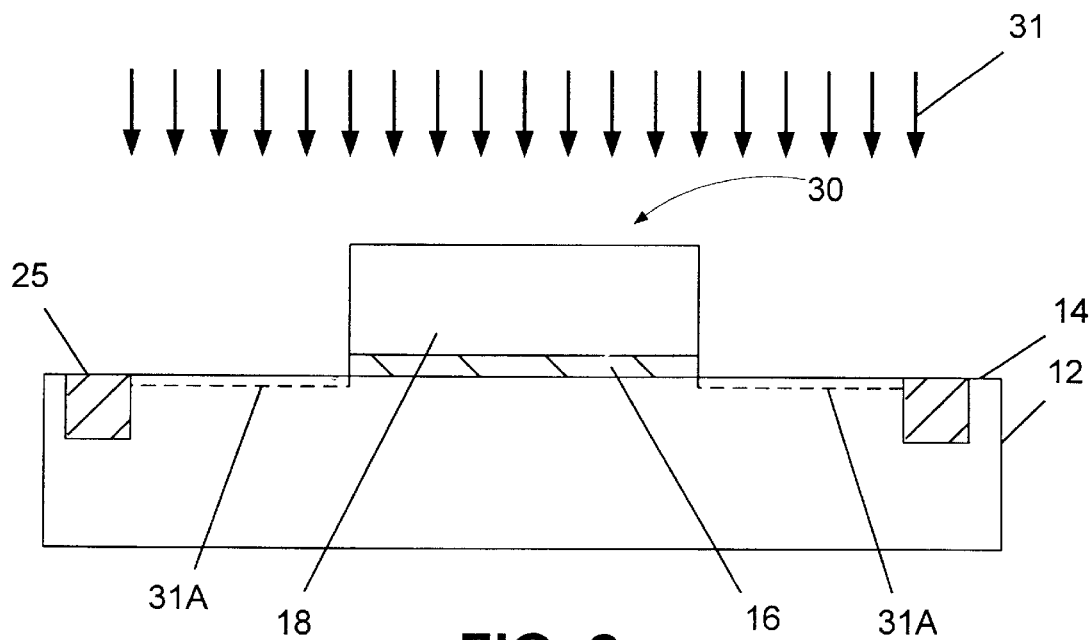
FIG. 2 depicts a partially formed semiconductor device wherein a first ion implantation process is performed to partially form the source/drain extensions of the device.

FIG. 2 depicts a partially formed semiconductor device 30 comprised of a gate electrode 18 and gate insulation layer 16. In general, the particular materials and techniques used to form the various components or layers of the transistor 30 depicted in FIG. 2, e.g., the gate insulation layer 16 and the gate electrode 18, are matters of design choice, and, thus, should not be considered a limitation of the present invention. For example, the gate insulation layer 16 may be comprised of silicon dioxide, and it may be formed by, for example, a thermal growth process or a deposition process. Similarly, the gate electrode 18 may be comprised of polysilicon, and it may be formed by, for example, a physical vapor deposition ("PVD") or a chemical vapor deposition ("CVD") process. In one illustrative embodiment, the gate electrode 18 is comprised of a layer of polysilicon having a thickness ranging from approximately 2000–4000 Å that is formed by a CVD process. The substrate 12 may be comprised of a variety of semiconducting materials, such as silicon.

As an overview, the present invention involves performing two ion implantation processes 31, 33 (described more fully below) to form the source/drain extensions of the completed device. That is, in contrast to prior art process flows wherein the source/drain extension implant is formed by a single ion implantation process, the present invention uses two implant processes to form the source/drain extensions. The parameters of these processes are set forth more fully below. After the two implant processes 31, 33 are performed, a third ion implantation process 35 (the source/drain implant) is performed to further form the final source/drain regions of the device.

As indicated in FIG. 2, a first ion implantation process, as indicated by arrows 31, is performed on the device to form doped regions 31A in the semiconducting substrate adjacent the gate electrode 18. This first ion implantation process 31 is used to partially form the source/drain extensions of the completed device. This initial implantation process 31 is performed at a relatively low energy level and at a relatively high concentration of dopant atoms (as compared to the implant process 33 described below). For example, the concentration of dopant atoms in the first ion implantation process may vary from approximately $1 \times 10^{15}$ to $1 \times 10^{16}$ ions/cm$^2$ of the appropriate dopant atoms, e.g., arsenic (Ar) or phosphorous (P) for NMOS technology, boron (B) or boron difluoride (BF$_2$) for PMOS technology, etc. The energy level for this first ion implantation process 31 will vary depending upon the dopant material used in the process. For example, in one illustrative embodiment for forming the source/drain extension implants in an NMOS device, the first ion implantation process 31 is performed using arsenic as the dopant atoms at a concentration ranging from approximately $1 \times 10^{15}$ to $1 \times 10^{16}$ ions/cm$^2$ and at an energy level ranging from approximately 100 eV to 3 keV. This results in a doped region 31A that has overall depth on the order of approximately 15–300 Å.

Figure 3:
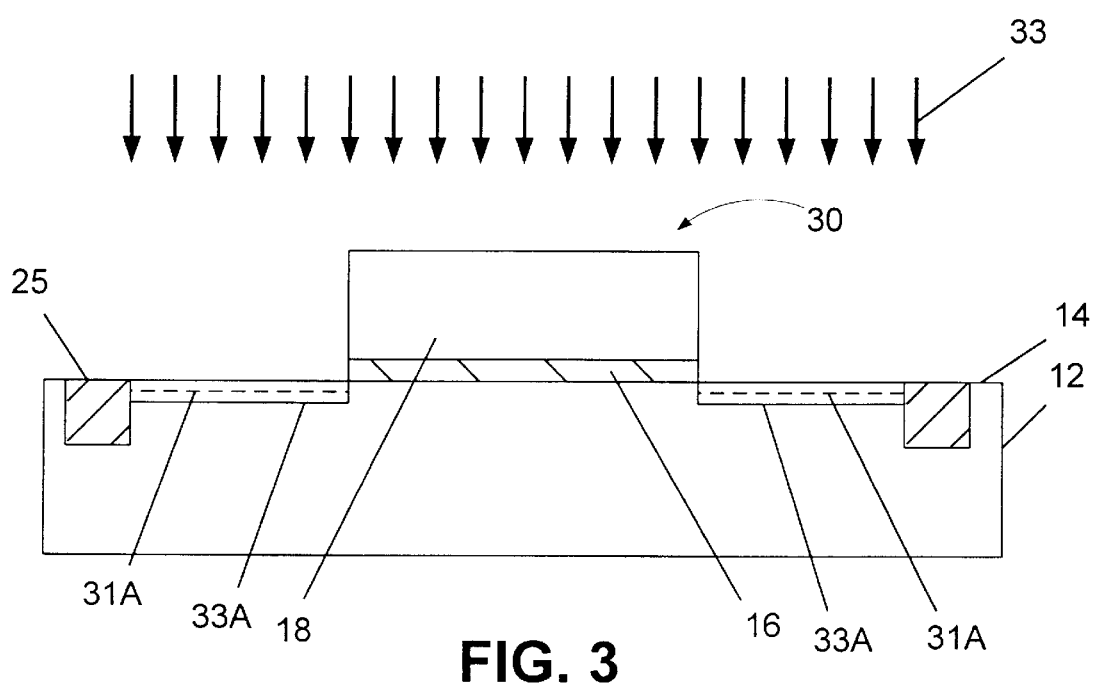
FIG. 3 depicts the device of FIG. 2 after a second ion implantation process is used to partially form the source/drain extensions of the device.

Next, as shown in FIG. 3, a second ion implantation process 33 is performed to form doped regions 33A in the substrate adjacent the gate electrode 18. This second ion implantation process 33 is also used to partially form the source/drain extensions of the completed device. Relative to the first implantation process 31, this second implantation process 33 is performed at a relatively higher energy level using a relatively lower dose of dopant atoms. For example, the concentration of dopant atoms in the second ion implantation process 33 may vary from approximately $1 \times 10^{14}$ to $9 \times 10^{14}$ ions/cm$^2$ of the appropriate dopant atoms, e.g., arsenic or phosphorous for NMOS technology, boron for PMOS technology, etc. The energy level for this second ion implantation process 33 will vary depending upon the dopant material used in the process. For example, in one illustrative embodiment for forming the source/drain extension implants in an NMOS device, the second ion implantation process 33 is performed using arsenic as the dopant atoms at a concentration of approximately $1 \times 10^{14}$ to $9 \times 10^{14}$ ions/cm$^2$ and at an energy level ranging from approximately 3 keV to 7 keV. This results in a doped region 33A that has an overall depth of approximately 100–600 Å.

Figure 4:
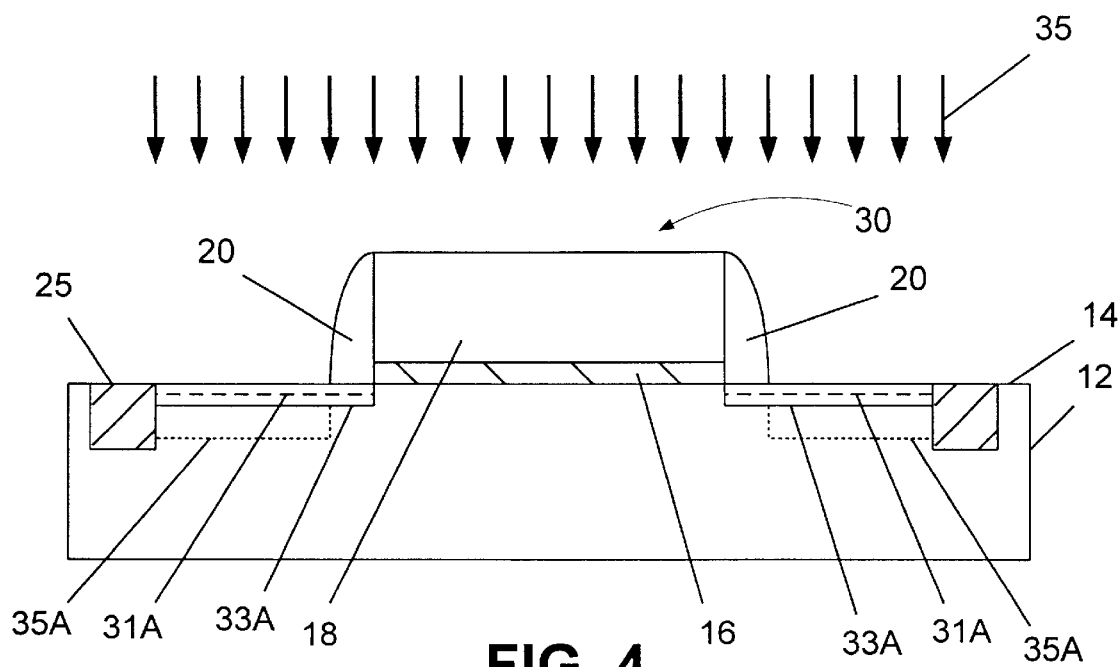
FIG. 4 depicts the device of FIG. 3 after a plurality of sidewall spacers have been formed adjacent the gate electrode of the device and a third source/drain implant process is performed on the device.

Next, as indicated in FIG. 4, a plurality of sidewall spacers 20 are formed adjacent the gate electrode 18. The sidewall spacers 20 are formed by depositing a layer of spacer material above the surface of the device and thereafter performing an anisotropic etching process to define the spacer 20. The layer of spacer material may be comprised of a variety of materials, such as silicon dioxide, silicon oxynitride, or other like materials. Moreover, it may be formed by any of a variety of techniques for forming such layers, such as chemical vapor deposition (CVD), physical vapor deposition (PVD), etc.

Thereafter, as indicated in FIG. 4, a third ion implantation process 35 is performed to form the doped regions 35A in the substrate. Note that the ion implantation process 35 is self-aligned with respect to the sidewall spacers 20. Moreover, this third ion implantation process 35 is normally considered to be the source/drain implant in modern semiconductor manufacturing operations. For example, the concentration of dopant atoms in the third ion implantation process 35 may vary from approximately $5 \times 10^{14}$ to $5 \times 10^{15}$ ions/cm$^2$ of the appropriate dopant atoms, e.g., arsenic or phosphorous for NMOS technology, boron for PMOS technology, etc. The energy level for this third ion implantation process 35 will vary depending upon the dopant material. For example, in one illustrative embodiment for forming the source/drain regions in an NMOS device, the third ion implantation process 35 is performed using arsenic as the dopant atoms at a concentration of approximately $5 \times 10^{14}$ to $5 \times 10^{15}$ ions/cm$^2$ and at an energy level ranging from approximately 20 keV to 40 keV. This results in a doped region 35A that has an overall depth on the order of approximately 1000–2000 Å in depth.

Figure 5:
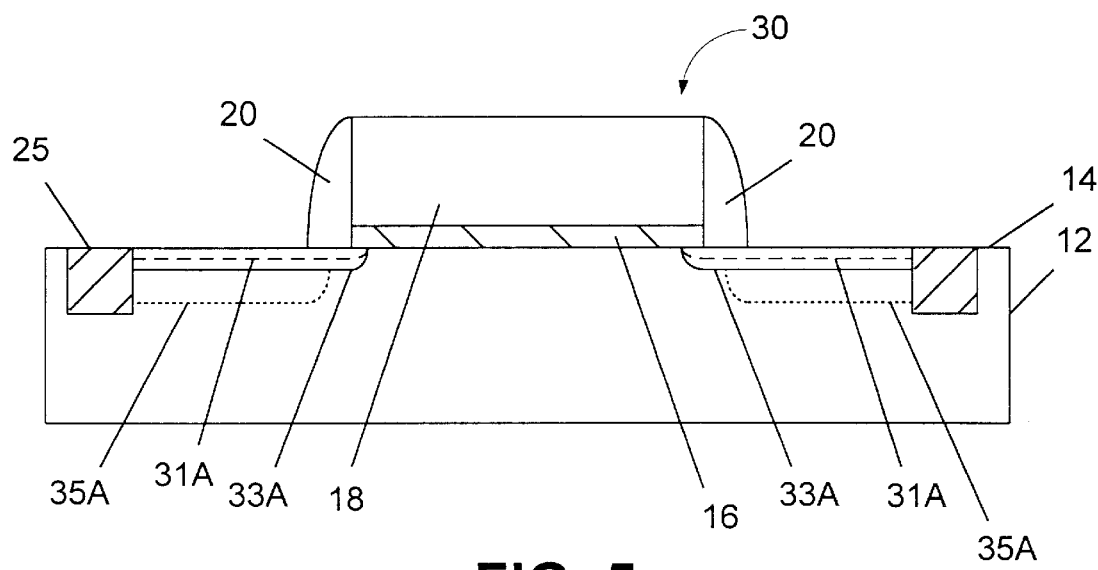
FIG. 5 depicts the device of FIG. 4 after it has been subjected to one or more anneal processes to activate the implanted dopant ions and to repair the damage to the lattice structure of the silicon substrate occasioned by the implantation processes described above.

Next, as shown in FIG. 5, the device is subjected to one or more thermal anneal processes whereby the dopant atoms introduced into the substrate during various ion implantation processes described above are activated and damage to the lattice structure of the semiconducting substrate resulting from the ion implantation processes is repaired. Note that during this process, the previously implanted dopant atoms migrate, or move, from their original implanted position. This migration of the dopant atoms is generally isotropic in direction, although the downward movement of such regions is not indicated in FIG. 5.

Although the various implant regions 31A, 33A and 35A are depicted in the drawings as having very precise and distinct boundaries, in practice at least portions of these regions will tend to merge together as a result of the implant processes and subsequent anneal processes performed on the device. Nevertheless, the drawings indicate these regions as being very precise and defined for purposes of explaining the present invention.

Moreover, although the present invention has been described in the context whereby the dopant atoms used during the various implantation processes 31, 33 and 35 are all the same, e.g., arsenic, the present invention should not be considered so limited. That is, as will be understood by those skilled in the art after a complete reading of the present application, various combinations of the appropriate type dopant atoms may be used with the present invention. For example, the first and third implants 31, 35 may be performed using arsenic, whereas the second implant 33 may be performed using phosphorous. As another example, the first two extension implants 31, 33 may both be performed using arsenic, and the third implant 35 may be performed using phosphorous. Other combinations are, of course, possible. Thus, the particular dopant atoms used in performing the present invention should not be considered a limitation of the present invention unless it is specifically set forth in the appended claims.

Another point worth noting is that the present invention has been disclosed in the context of forming source/drain regions 40 in an illustrative NMOS device. During this illustrative process flow, the dual extension implants 31, 33 are generally self-aligned with respect to the gate electrode 18, although there may be some slight scattering during the implantation processes. However, this may not be required for all NMOS devices. Moreover, with respect to PMOS devices, a sidewall spacer (not shown) may be formed adjacent the gate electrode 18 prior to performing one or both of the extension implants 31, 33, such that the implants 31, 33 are generally self-aligned with respect to this spacer. This spacer may or may not be sacrificial in nature. Such a spacer is sometimes used in PMOS technology due to the increased mobility of P-type dopant atoms, particularly boron, as compared to N-type dopant atoms, arsenic or phosphorous, during subsequent anneal processes. That is, the sidewall spacer may be formed so as to initially locate the P-type implants further away from the gate electrode 18 (and the channel region of the device) so that the implants will have room to migrate.

As stated previously, the energy levels of the various implant processes 31, 33, 35 will vary depending upon the dopant materials used during these processes. The illustrative energy levels used in the implant process 31, 33, 35 described herein for implanting arsenic in an illustrative NMOS device would need to be scaled based upon the dopant atoms used, while maintaining the approximate dopant concentration levels described herein, at least for the two extension implants 31, 33.

The various energy level ranges described herein were provided for the situation where arsenic was used as the dopant atoms in an NMOS device. Arsenic has an atomic weight of approximately 75. Other possible dopant materials, such as phosphorous, boron, and boron difluoride, have typical atomic weights of approximately 31, 11 and 49, respectively. When using these dopant materials, the various energy levels disclosed herein would have to be scaled accordingly. For example, using phosphorous as the dopant atoms, given its lower atomic weight relative to arsenic, the energy levels described above would need to be reduced by the ratio of approximately 11/75. The following table indicates illustrative energy values for use with various dopant atoms.

| Dopant Atoms | Typical Approximate Atomic Weight | First Extension Implant Approximate Energy Level | Second Extension Approximate Implant Energy Level | Source/Drain Implant Approximate Energy Level |
|---|---|---|---|---|
| Arsenic | 75 | 100 eV–3 keV | 3 keV–7 keV | 20 keV–40 keV |
| Phosphorous | 31 | 41 eV–1.2 keV | 1.2 keV–2.9 keV | 8.3 keV–16.5 keV |
| Boron | 11 | 15 eV–440 eV | 440 eV–1 keV | 3 keV–6 keV |
| Boron difluoride | 49 | 65 eV–2 keV | 2 keV–5 keV | 13 keV–26 keV |

Through use of the present invention, semiconductor devices may be formed that exhibit lower leakage currents than prior art devices. This in turn will lead to devices with enhanced performance capability and the performance of integrated circuit devices comprised of such semiconductor devices.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming source/drain regions in a semiconductor device, comprising:

forming a gate electrode above a semiconducting substrate;

forming source/drain regions in said substrate adjacent said gate electrode by performing at least the following steps:

performing a first ion implantation process using arsenic at a dopant concentration level ranging from approximately $1\times10^{15}$ to $1\times10^{16}$ ions/cm$^2$ and at an energy level ranging from approximately 100 eV–3 keV to partially form source/drain extensions for the device;

performing a second ion implantation process using arsenic at a dopant concentration level ranging from approximately $1\times10^{14}$ to $9\times10^{14}$ ions/cm$^2$ and at an energy level ranging from approximately 3–7 keV to partially form source/drain extensions for the device; and performing a third ion implantation process to further form source/drain regions for the device using dopant atoms comprised of at least one of arsenic and phosphorous.

2. The method of claim 1, wherein performing a third ion implantation process to further form source/drain regions for the device, comprises performing a third ion implantation process at a dopant concentration level ranging from approximately $5\times10^{14}$ to $5\times10^{15}$ ions/cm$^2$.

3. The method of claim 1, further comprising forming at least one sidewall spacer adjacent said gate electrode, said third ion implantation process being performed after said formation of said at least one sidewall spacer.

4. The method of claim 1, wherein said first and second ion implantation processes used to partially form said source/drain extensions are each self-aligned with respect to said gate electrode.

5. The method of claim 1, wherein performing a third ion implantation process to further form source/drain regions for the device comprises performing a third ion implantation process at a dopant concentration level ranging from approximately $5\times10^{14}$ to $5\times10^{15}$ ions/cm$^2$.

6. The method of claim 1, further comprising performing at least one anneal process to activate dopant atoms introduced into said substrate during said first, second and third ion implantation processes.

7. A method of forming source/drain regions in a semiconductor device, comprising:

forming a gate electrode above a semiconducting substrate;

forming source/drain regions in said substrate adjacent said gate electrode by performing at least the following steps:

performing a first ion implantation process using phosphorous at a dopant concentration level ranging from approximately $1\times10^{15}$ to $1\times10^{16}$ ions/cm$^2$ and at an energy level ranging from approximately 41 eV–1.2 keV to partially form source/drain extensions for the device;

performing a second ion implantation process using phosphorous at a dopant concentration level ranging from approximately $1\times10^{14}$ to $9\times10^{14}$ ions/cm$^2$ and at an energy level ranging from approximately 1.2–2.9 keV to partially form source/drain extensions for the device; and performing a third ion implantation process to further form source/drain regions for the device using dopant atoms comprised of at least one of arsenic and phosphorous.

8. The method of claim 7, wherein performing a third ion implantation process to further form source/drain regions for the device, comprises performing a third ion implantation process at a dopant concentration level ranging from approximately $5\times10^{14}$ to $5\times10^{15}$ ions/cm$^2$.

9. The method of claim 7, further comprising forming at least one sidewall spacer adjacent said gate electrode, said third ion implantation process being performed after said formation of said at least one sidewall spacer.

10. The method of claim 7, wherein said first and second ion implantation processes used to partially form said source/drain extensions are each self-aligned with respect to said gate electrode.

11. The method of claim 7, wherein performing a third ion implantation process to further form source/drain regions for the device comprises performing a third ion implantation process at a dopant concentration level ranging from approximately $5\times10^{14}$ to $5\times10^{15}$ ions/cm$^2$.

12. The method of claim 7, further comprising performing at least one anneal process to activate dopant atoms introduced into said substrate during said first, second and third ion implantation processes.

13. A method of forming source/drain regions in a semiconductor device, comprising:

forming a gate electrode above a semiconducting substrate;

forming source/drain regions in said substrate adjacent said gate electrode by performing at least the following steps:

performing a first ion implantation process using boron at a dopant concentration level ranging from approximately $1\times10^{15}$ to $1\times10^{16}$ ions/cm$^2$ and at an energy level ranging from approximately 15–440 eV to partially form source/drain extensions for the device;

performing a second ion implantation process using boron at a dopant concentration level ranging from approximately $1\times10^{14}$ to $9\times10^{14}$ ions/cm$^2$ and at an energy level ranging from approximately 440 eV–1 keV to partially form source/drain extensions for the device; and performing a third ion implantation process to further form source/drain regions for the device using dopant atoms comprised of at least one of boron and boron difluoride.

14. The method of claim 13, wherein performing a third ion implantation process to further form source/drain regions for the device, comprises performing a third ion implantation process at a dopant concentration level ranging from approximately $5\times10^{14}$ to $5\times10^{15}$ ions/cm$^2$.

15. The method of claim 13, further comprising forming at least one sidewall spacer adjacent said gate electrode, said third ion implantation process being performed after said formation of said at least one sidewall spacer.

16. The method of claim 13, wherein said first and second ion implantation processes used to partially form said source/drain extensions are each self-aligned with respect to said gate electrode.

17. The method of claim 13, wherein said first and second ion implantation processes used to partially form said source/drain extensions are each self-aligned with respect to a sidewall spacer formed adjacent the gate electrode.

18. The method of claim 13, wherein performing a third ion implantation process to further form source/drain regions for the device comprises performing a third ion implantation process at a dopant concentration level ranging from approximately $5 \times 10^{14}$ to $5 \times 10^{15}$ ions/cm$^2$.

19. The method of claim 13, further comprising performing at least one anneal process to activate dopant atoms introduced into said substrate during said first, second and third ion implantation processes.

20. A method of forming source/drain regions in a semiconductor device, comprising:
  forming a gate electrode above a semiconducting substrate;
  forming source/drain regions in said substrate adjacent said gate electrode by performing at least the following steps:
    performing a first ion implantation process using boron difluoride at a dopant concentration level ranging from approximately $1 \times 10^{15}$ to $1 \times 10^{16}$ ions/cm$^2$ and at an energy level ranging from approximately 65 eV–2 keV to partially form source/drain extensions for the device;
    performing a second ion implantation process using boron difluoride at a dopant concentration level ranging from approximately $1 \times 10^{14}$ to $9 \times 10^{14}$ ions/cm$^2$ and at an energy level ranging from approximately 2–5 keV to partially form source/drain extensions for the device; and
    performing a third ion implantation process to further form source/drain regions for the device using dopant atoms comprised of at least one of boron and boron difluoride.

21. The method of claim 20, wherein performing a third ion implantation process to further form source/drain regions for the device, comprises
  performing a third ion implantation process at a dopant concentration level ranging from approximately $5 \times 10^{14}$ to $5 \times 10^{15}$ ions/cm$^2$.

22. The method of claim 20, further comprising forming at least one sidewall spacer adjacent said gate electrode, said third ion implantation process being performed after said formation of said at least one sidewall spacer.

23. The method of claim 20, wherein said first and second ion implantation processes used to partially form said source/drain extensions are each self-aligned with respect to said gate electrode.

24. The method of claim 20, wherein said first and second ion implantation processes used to partially form said source/drain extensions are each self-aligned with respect to a sidewall spacer formed adjacent the gate electrode.

25. The method of claim 20, wherein performing a third ion implantation process to further form source/drain regions for the device comprises performing a third ion implantation process at a dopant concentration level ranging from approximately $5 \times 10^{14}$ to $5 \times 10^{15}$ ions/cm$^2$.

26. The method of claim 20, further comprising performing at least one anneal process to activate dopant atoms introduced into said substrate during said first, second and third ion implantation processes.

27. A method of forming source/drain regions in a semiconductor device, comprising:
  forming a gate electrode above a semiconducting substrate;
  forming source/drain regions in said substrate adjacent said gate electrode by performing at least the following steps:
    performing two ion implantation processes to form source/drain extensions for the device by:
      performing a first ion implantation process using arsenic at a dopant concentration level ranging from approximately $1 \times 10^{15}$ to $1 \times 10^{16}$ ions/cm$^2$ and at an energy level ranging from approximately 100 ev–3 keV, and
      performing a second ion implantation process at a dopant concentration level ranging from approximately $1 \times 10^{14}$ to $9 \times 10^{14}$ ions/cm$^2$ and at an energy level ranging from approximately 3–7 keV; and
    performing a third ion implantation process to further form source/drain regions for the device by:
      performing a third ion implantation process at a dopant concentration level ranging from approximately $5 \times 10^{14}$ to $5 \times 10^{15}$ ions/cm$^2$.

28. The method of claim 27, further comprising forming at least one sidewall spacer adjacent said gate electrode, said third ion implantation process being performed after said formation of said at least one sidewall spacer.

29. The method of claim 27, wherein said two ion implantation processes used to form said source/drain extensions are each self-aligned with respect to said gate electrode.

30. The method of claim 27, wherein said third ion implantation process is performed using arsenic at an energy level ranging from approximately 20–40 keV.

31. The method of claim 27, further comprising performing at least one anneal process to activate dopant atoms introduced into said substrate during said first, second and third ion implantation processes.

32. A method of forming source/drain regions in a semiconductor device, comprising:
  forming a gate electrode above a semiconducting substrate;
  forming source/drain regions in said substrate adjacent said gate electrode by performing at least the following steps:
    performing two ion implantation processes to form source/drain extensions for the device by:
      performing a first ion implantation process using phosphorous at a dopant concentration level ranging from approximately $1 \times 10^{15}$ to $1 \times 10^{16}$ ions/cm$^2$ and at an energy level ranging from approximately 41 eV–1.2 keV, and
      performing a second ion implantation process using phosphorous at a dopant concentration level ranging from approximately $1 \times 10^{14}$ to $9 \times 10^{14}$ ions/cm$^2$ and at an energy level ranging from approximately 1.2–2.9 keV; and
    performing a third ion implantation process to further form source/drain regions for the device by:
      performing a third ion implantation process at a dopant concentration level ranging from approximately $5 \times 10^{14}$ to $5 \times 10^{15}$ ions/cm$^2$.

33. A method of forming source/drain regions in a semiconductor device, comprising:
  forming a gate electrode above a semiconducting substrate;
  forming source/drain regions in said substrate adjacent said gate electrode by performing at least the following steps:
    performing two ion implantation processes to form source/drain extensions for the device by:
      performing a first ion implantation process using boron at a dopant concentration level ranging from approximately $1\times10^{15}$ to $1\times10^{16}$ ions/cm$^2$ and at an energy level ranging from approximately 15–440 eV, and performing a second ion implantation process using boron at a dopant concentration level ranging from approximately $1\times10^{14}$ to $9\times10^{14}$ ions/cm$^2$ and at an energy level ranging from approximately 440 eV–1 keV; and performing a third ion implantation process to further form source/drain regions for the device by:

performing a third ion implantation process at a dopant concentration level ranging from approximately $5\times10^{14}$ to $5\times10^{15}$ ions/cm$^2$.

34. A method of forming source/drain regions in a semiconductor device, comprising:

forming a gate electrode above a semiconducting substrate;

forming source/drain regions in said substrate adjacent said gate electrode by performing at least the following steps:

performing two ion implantation processes to form source/drain extensions for the device by:

performing a first ion implantation process using boron difluoride at a dopant concentration level ranging from approximately $1\times10^{15}$ to $1\times10^{16}$ ions/cm$^2$ and at an energy level ranging from approximately 65 eV–2 keV, and performing a second ion implantation process using boron difluoride at a dopant concentration level ranging from approximately $1\times10^{14}$ to $9\times10^{14}$ ions/cm$^2$ and at an energy level ranging from approximately 2–5 keV; and performing a third ion implantation process to further form source/drain regions for the device by:

performing a third ion implantation process at a dopant concentration level ranging from approximately $5\times10^{14}$ to $5\times10^{15}$ ions/cm$^2$.

* * * * *